(12) United States Patent
Sinha et al.

(10) Patent No.: US 8,373,519 B2
(45) Date of Patent: Feb. 12, 2013

(54) SWITCHABLE POWER COMBINER

(75) Inventors: Rajarishi Sinha, Pittsburgh, PA (US); L. Richard Carley, Sewickley, PA (US)

(73) Assignee: Resonance Semiconductor Corporation, Pittsburgh, PA (US)

( * ) Notice: Subject to any disclaimer, the term of this patent is extended or adjusted under 35 U.S.C. 154(b) by 193 days.

(21) Appl. No.: 12/693,884

(22) Filed: Jan. 26, 2010

(65) Prior Publication Data
US 2010/0277237 A1  Nov. 4, 2010

Related U.S. Application Data

(60) Provisional application No. 61/147,233, filed on Jan. 26, 2009.

(51) Int. Cl.
H01P 1/10 (2006.01)
H01L 41/00 (2006.01)

(52) U.S. Cl. .......................................... 333/101; 310/318
(58) Field of Classification Search .................. 333/186, 333/187, 188, 189, 191, 192, 101; 310/318; 375/297
See application file for complete search history.

(56) References Cited

U.S. PATENT DOCUMENTS

| 6,114,797 A * | 9/2000 | Bishop et al. ................ 310/318 |
| 6,534,900 B2 | 3/2003 | Aigner et al. |
| 6,747,529 B2 | 6/2004 | Abe et al. |
| 7,122,939 B2 * | 10/2006 | Chou et al. .................... 310/318 |
| 7,586,391 B2 | 9/2009 | Volatier et al. |
| 7,687,971 B2 | 3/2010 | Stokes et al. |
| 7,956,705 B2 * | 6/2011 | Meister et al. ................ 333/189 |
| 7,973,620 B2 * | 7/2011 | Shirakawa et al. ........... 333/189 |

| 2003/0102775 A1 | 6/2003 | Fujimura et al. |
| 2005/0285476 A1 | 12/2005 | Chou et al. |
| 2009/0289526 A1 | 11/2009 | Sinha et al. |
| 2010/0272214 A1 * | 10/2010 | Wurm et al. ................... 375/297 |

FOREIGN PATENT DOCUMENTS

| JP | 2009026994 A * | 2/2009 |
| KR | 20020065206 A | 8/2002 |
| KR | 20050072565 A | 7/2005 |
| WO | 2006/004470 | 1/2006 |

OTHER PUBLICATIONS

International Search Report, PCT/US2010/000226, dated Jan. 26, 2010.
G.N. Saddik, D. S. Boesoh, S. Stemmer, and A. A. York "dc electric field tunable bulk acoustic wave solidly mounted resonator using SrTiO3", Applied Physics Letters 91, 043501 (2007).

(Continued)

Primary Examiner — Dean O Takaoka
(74) Attorney, Agent, or Firm — Lerner, David, Littenberg, Krumholz & Mentlik, LLP

(57) ABSTRACT

A switchable power combiner is disclosed. The switchable power combiner has an output section that is a signal source connected to a transformer section. The transformer section has one or more primaries and a common secondary. The transformer primaries and secondary are acoustically coupled. The primaries or/and the secondary are made of switchable piezoelectric material, such that the acoustic coupling between any primary and the secondary can be switched on or off by electrical control, thereby implementing a switchable power combiner. The transformer secondary is connected to an antenna port. The power amplifier output section is segmented and connected to the transformer primaries. The power amplifier output section has a plurality of power amplifiers and a plurality of reactance elements, either fixed or variable. The switchable power combiner generates different linear load lines by switching on and off the coupling between any primary and the secondary.

35 Claims, 13 Drawing Sheets

OTHER PUBLICATIONS

John Berge, Andrei Vorobiev, William Steichen, and Spartak Gevorgian, "Tunable Solidly Mounted Thin Film Bulk Acoustic Resonators Based on BaxSr1-xTiO3 Films", EEE Microwave and W~Eless Components Letters, vol. 17, No. 9 Sep. 2007 655.

S.Gevorgian and A. Vorobiev, "dc field and temperature dependent acoustic resonances in parallel-plate capacitors based on SrTiO3 and Ba0 25Sr0.75TiO3 films: Experiment and modeling", Journal of Applied Physics 99, 124112 (2006).

Xinen Zhu, Jamie D. Phillips, and Amir Mortazawi "A DC Voltage Dependant Switchable Thin Film Bulk Wave Acoustic Resonator Using Ferroelectric Thin Film", Department of Electrical Engineering and Computer Science, University of Michigan, Ann Arbor, MI 48109, USA, pp. 671-674.

* cited by examiner

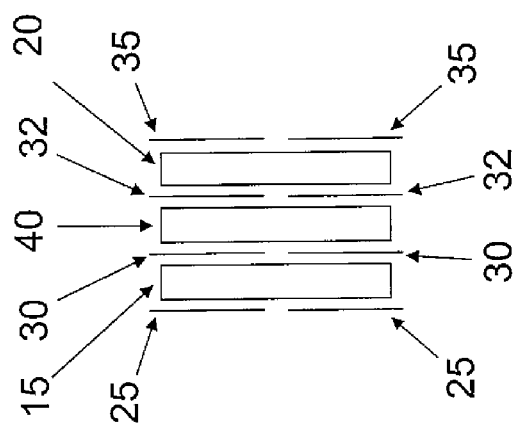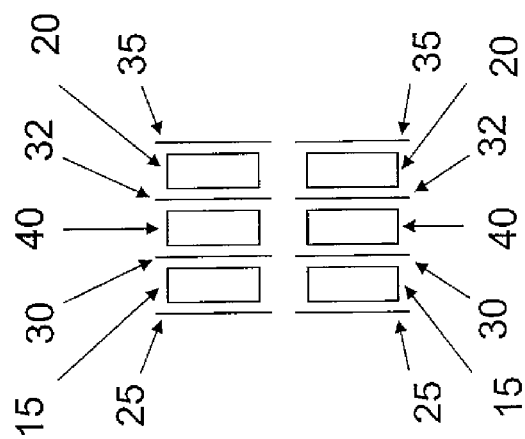

SWITCHABLE POWER COMBINER

CROSS REFERENCE TO RELATED APPLICATIONS

This application claims the benefit of the filing date of U.S. Provisional Patent Application No. 61/147,233 filed Jan. 26, 2009, the disclosure of which is hereby incorporated herein by reference.

BACKGROUND OF THE INVENTION

In wireless communications, a power amplifier is often required to produce a range of output power levels. For example, in a mobile telephone system, a base station may dictate the power level at which each mobile handset should transmit (based on factors such as the physical distance from the base station, for example). A critical performance metric for handset power amplifiers in this type of environment relates to efficiency, as defined as the ratio of the power delivered to the antenna to the power drawn by the power amplifier. Simple power amplifiers typically achieve their highest efficiency for their maximum output power, and their efficiency falls off significantly as the desired operating output power is reduced from this maximum (a condition referred to as back-off). To maintain high efficiency in back-off operation, it is beneficial that a power amplifier utilizes a segmented architecture, whereby multiple power amplifier segments can deliver power to the antenna. The number of power amplifier segments that are turned on at a given moment will depend upon the output power requirements at that moment. Segmented power amplifier architectures require a low-loss means to combine and deliver to the antenna the power output by one or more turned-on power amplifier segments, while other power amplifier segments are turned off.

The efficiency of power amplifiers is further degraded when certain design assumptions are not met in operation. One important design assumption is the antenna impedance, which is typically assumed to be 50 ohms. However, handset design and the environments in which handsets are used cause the antenna impedance to vary. Antenna impedance will change due to a variety of factors, such as changing handset geometry (e.g., closing a flip phone can change the antenna impedance) or a change in the region surrounding a handset (e.g., placing the phone next to one's head). As a result of these changes, the power amplifier is less efficient at coupling power into the antenna.

To accomplish impedance matching and maintain high efficiency, the optimal load impedance of the power amplifier must be varied to match the impedance of the antenna.

There is therefore a need to efficiently and adaptively combine the power output by multiple power amplifier segments, and to efficiently and adaptively match the power amplifier's optimal load impedance to the variable antenna impedance. Previously, PIN diodes and GaAs FET switches have been used to connect and disconnect segmented power amplifier sections in order to improve efficiency of operation in backed-off mode. Also, PIN diodes, GaAs FET and SOS FET switches have been used to adjust the reactance of the power amplifier output matching networks in order to improve coupling to the antenna when the antenna is detuned. However, the PIN diodes consume current even in the off state, and GaAs FET devices and SOS FET devices cause a high insertion loss. Consequently, the use of these structures can result in a loss in efficiency and/or undesirably large power consumption in the switches.

Aoki, I. et al., "Distributed Active Transformer—A New Power-Combining and Impedance-Transformation Technique," *IEEE Transactions on Microwave Theory and Techniques*, Vol. 50:1, pp. 316-331 (January 2002), describes a distributed active transformer (DAT) structure for on-chip impedance matching and power combining. The solution uses push-pull amplifiers, ac virtual grounds, and magnetic coupling for series power combining. U.S. Pat. No. 6,856,199 entitled "Reconfigurable Distributed Active Transformers" also describes a DAT. An alternative power combiner configuration (i.e. transmission-line transformer) is described in Niknejad, A., et al., "Integrated circuit transmission-line transformer power combiner for millimeter-wave applications," *Electronics Letters*, Vol. 43:5, (March 2007). U.S. Pat. No. 7,161,423 to Paul at al. also describes a power amplifier with multiple power amplifier segments that can be selectively disabled to provide different output power levels. However, the power amplifier segments that are turned off in back-off condition introduce an undesirable parasitic load on the circuit. Therefore, these solutions do not provide for efficient conversion of the power amplifier output impedance to match the antenna impedances in a back-off condition.

A power dividing/combining apparatus is also described in US Patent Application Publication No. 2008/0001684 entitled "Power Combiners Using Meta-Material Composite Right/Left Hand Transmission Line (CRLHTL) at Infinite Wavelength Frequency" and filed on May 3, 2007. Transmission lines in this reference are made of highly specialized materials that are used to create composite right/left handed lines that form a zero degree line. Tunnel-diode oscillators are connected directly to such lines to combine the power in-phase. Alternatively, zero degree transmission lines are used to implement stationary-wave resonators with oscillators loosely coupled to them. However this solution requires the use of very specialized materials manufactured in specialized processes. Furthermore, when all oscillators are not simultaneously turned on, the inactive portions of the transmission lines may present high parasitic loading to the entire circuit. The use of switches with this design would reduce efficiency and increase power consumption.

Consequently, power combiners with improved efficiency for impedance matching to the variable-impedance antenna are sought.

SUMMARY OF THE INVENTION

A switchable power combiner is described herein that includes a piezoelectric transformer whose primary or secondary (or both) can be efficiently switched on or off, enabling efficient electronically-controlled reconfiguration of radio-frequency (RF) power amplifiers and other circuits. The switchable power combiner has a transformer section that is configured to receive a signal input. The signal input is received from the output section of the switchable power combiner. The output section is therefore the signal source for the transformer section. The specific signal source will depend upon the desired use for the switchable power combiner. Power amplifiers are but one example of contemplated signal sources, and other circuits are contemplated as suitable. In one embodiment, the switchable power combiner has a power amplifier output section connected to a transformer section. The power amplifier output section and the transformer section are segmented such that the power amplifier output section has a plurality of differential amplifiers in parallel, each connected to a segment of the transformer section. Although the power amplifiers are described herein as differential, the power amplifiers may also be single-ended.

The transformer section has a primary and a secondary, each interposed between two electrodes. The primary and secondary are made of piezoelectric or switchable piezoelectric material, with at least one of the primary and secondary made of a switchable piezoelectric material. A switchable piezoelectric material is a material that exhibits piezoelectric behavior when subjected to a certain threshold condition (typically an electrical bias voltage of sufficiently high value). The state of the switchable piezoelectric is controlled separately in each segment of the transformer section. When the threshold condition is applied to the switchable piezoelectric in one transformer segment, that transformer segment acoustically couples energy between its primary and its secondary. Conversely, in the absence of the threshold condition, the switchable piezoelectric primary or secondary (or both) is switched off in the sense that the material does not exhibit piezoelectric behavior, so the transformer segment does not couple energy between its primary and its secondary, and energy applied to the secondary of the transformer (e.g., applied by transformer segments that are switched on) is not consumed by the those segments of the transformer that are switched off.

BRIEF DESCRIPTION OF THE DRAWINGS

FIG. 1C illustrates a switchable transformer with coupling layers, in which all electrodes are segmented in accordance with an embodiment of the present invention;

FIG. 1D illustrates a switchable transformer with coupling layers, in which all electrodes, the primary, the coupling layers, and the secondary are segmented in accordance with an embodiment of the present invention;

DETAILED DESCRIPTION OF THE INVENTION

Figure 1A:
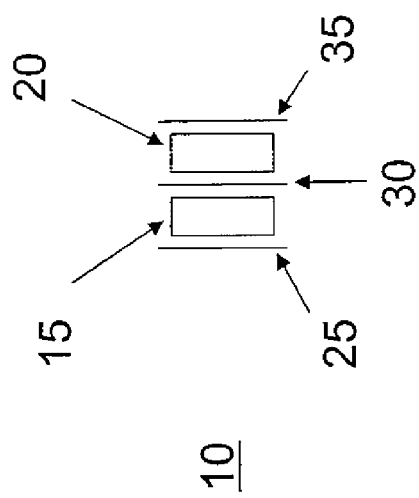
FIG. 1A illustrates a switchable transformer in accordance with an embodiment of the present invention.

The basic structure of the switchable transformer according to one embodiment is illustrated schematically in FIG. 1A. The transformer 10 has a primary 15 and a secondary 20. Primary and secondary are conventional terms used to refer to the transformer input and output sections. In the specific embodiments provided herein primary refers to the transformer section input and secondary refers to the transformer section output. However, the skilled person will appreciate that, since transformers couple energy from secondary to primary as well as from the primary to the secondary, transformer sections with the secondary as the input and the primary as the output are also contemplated herein. The primary 15 and secondary 20 of the transformer 10 are made of piezoelectric or switchable piezoelectric materials. At least one of the primary 15 and the secondary is made of a switchable piezoelectric material. The primary 15 is connected on its top and bottom surfaces by electrodes 25 and 30. The secondary 20 is connected on its top and bottom surfaces by electrodes 30 and 35. In the case that the primary 15 is made of a switchable piezoelectric, the electrodes 25 and 30 are used to apply a DC bias field that performs the switching function, as well as to apply the RF signal to be coupled to the secondary. In the case that the secondary 20 is made of a switchable piezoelectric, the electrodes 30 and 35 are used apply a DC bias voltage that performs the switching function, as well as to apply the RF signal to be coupled to the primary. Electrode 30 is a common electrode for both the primary 15 and the secondary 25, and may be connected to a DC voltage source.

Figure 1B:
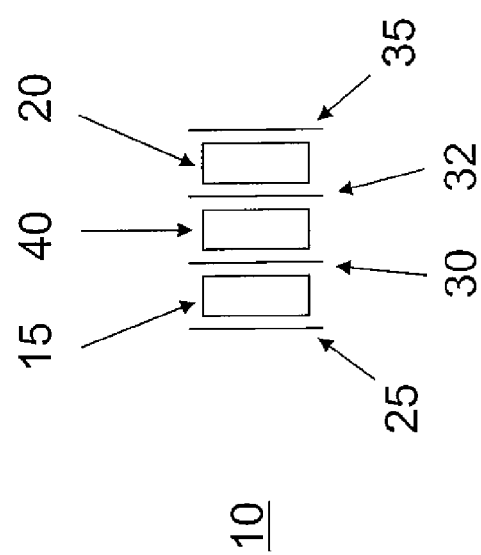
FIG. 1B illustrates a switchable transformer with coupling layers in accordance with an embodiment of the present invention.

A second embodiment of the switchable transformer is illustrated in FIG. 1B. In this embodiment, the transformer 10 has acoustic coupling layers 40 inserted between the primary 15 and the secondary 20. In this structure, the primary and secondary do not share a common electrode, and the electrodes for the primary and secondary are electrically separated by the coupling layers 40, which include at least one layer of dielectric material. Such a switchable transformer is useful where more that one switchable transformer is in use and in applications that requires the ability to independently and separately connect to the electrodes in the transformer. In addition, the coupling layers 40 can serve to broaden the bandwidth of the transformer, as one skilled in the art will appreciate.

The primary 15 and secondary 20 of the transformer are made of piezoelectric or switchable piezoelectric materials. At least one of the primary 15 and the secondary 20 is made of a switchable piezoelectric material.

Both the primary 15 and the secondary 20 have their top and bottom surfaces disposed between electrodes. In the case that the primary 15 is made of a switchable piezoelectric material, the electrodes 25 and 30 are used to apply a DC bias voltage that performs the switching function, as well as to apply the RF signal to be coupled to the secondary. In the case that the secondary 20 is made of a switchable piezoelectric material, the electrodes 30 and 35 are used to apply a DC bias field that performs the switching function, as well as to apply the RF signal to be coupled to the primary.

The primary 15 and the secondary 20 are acoustically connected by coupling layers 40, which include at least one layer of dielectric material. These layers are designed to couple acoustic energy between the primary and the secondary with minimal dissipation of energy, while simultaneously dielectrically isolating the electrodes of the primary from those of the secondary. In addition, the one or more coupling layers can serve to broaden the bandwidth of the transformer. As one skilled in the art will recognize, coupling layers 40 may be implemented with a single layer of dielectric material.

A third embodiment of the switchable transformer is illustrated in FIG. 1C. This switchable transformer has electrodes 25, 30, 32 and 35 that are segmented, and it is otherwise similar to that illustrated in FIG. 1B. The switchable transformer with segmented electrodes can be configured for multiple purposes by electrically connecting the segmented electrodes. For example, as illustrated below, a switchable power combiner can be implemented by connecting a segmented switchable transformer (with the primary made of a switchable piezoelectric material) to have multiple separate primaries and a common secondary, such that any or all primaries may be acoustically coupled to the common secondary. As a second example, also illustrated below, a differential to single-ended converter can be implemented by connecting a two-segment segmented transformer with the primary or secondary electrodes crossed-over between the two segments.

A fourth embodiment of the switchable transformer is illustrated in FIG. 1D. In this embodiment, the transformer 10 has segmented electrodes 25, 30, 32 and 35, as well as a segmented primary 15, segmented coupling layers 40, and a segmented secondary 20. This transformer is functionally equivalent to the embodiment illustrated in FIG. 1C, but the segmentation of the acoustically active layers facilitates manufacturing and it facilitates the suppression of undesired acoustic coupling between segments (e.g., between segmented primaries) of a segmented transformer.

Figure 1E:
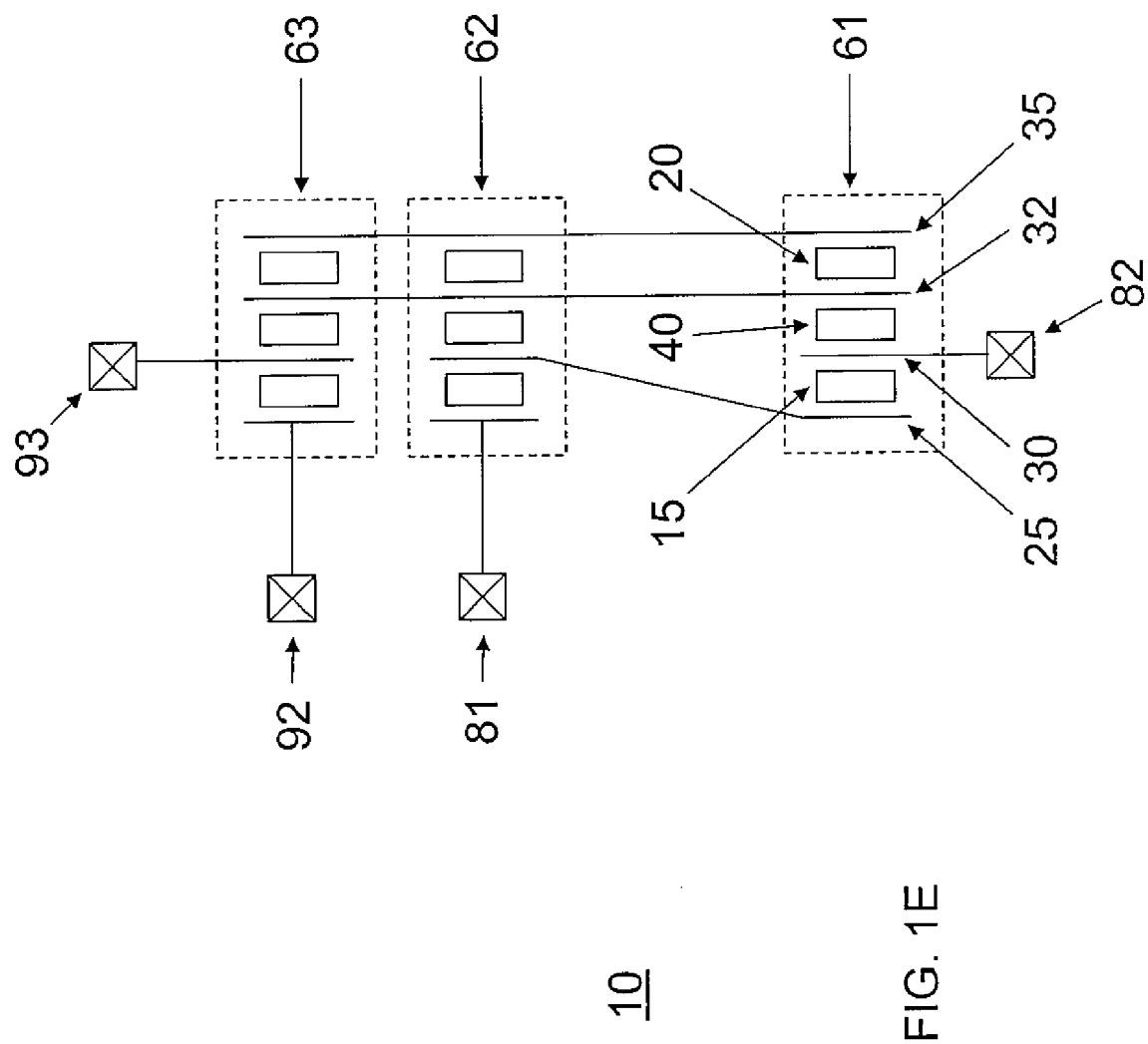
FIG. 1E illustrates a switchable transformer with coupling layers which converts the input signal from differential to single-ended, and in which the primary-to-secondary impedance ratio is set by the in-plane dimensions of the transformer, in accordance with an embodiment of the present invention.

A fifth embodiment of the switchable transformer is illustrated in FIG. 1E. It is composed of a three-segment segmented switchable transformer, in which the segmented electrodes are connected to convert the input signal from differential to single-ended, and to provide a different impedance at the secondary than at the primaries, based on the in-plane dimensions of the transformer.

Each of the three segments 61, 62 and 63 of the switchable transformer is similar to the basic switchable transformer illustrated in FIG. 1B, with the primary 15 made of a switchable piezoelectric material and secondary 20 made of a piezoelectric material. The first electrode 25 of the first segment 61 is electrically connected to the second electrode 30 of the second segment 62. The third electrode 32 of segments 61, 62 and 63 is electrically connected, and the fourth electrode 35 of segments 61, 62, 63 is electrically connected. The first electrode 25 of segment 62 is connected to pin 81 and is defined as the non-inverting input of the switchable transformer. The second electrode 30 of segment 61 is connected to pin 82 and is defined as the inverting input of the transformer. The first electrode 25 of segment 63 is connected to pin 92 and is defined as the in-phase output of the transformer. The second electrode 30 of segment 63 is connected to pin 93 and is defined as the reference output of the transformer.

As indicated above, the first electrode 25 of segment 61 and the second electrode 30 of segment 62 are connected electrically. Those two connected electrodes can be considered a combined "cross-over" electrode. The connection of pin 81 to the first electrode 15 of segment 62, along with the connection of pin 82 to the second electrode of segment 61, and the connection of the first electrode 25 of segment 61 with the second electrode 30 of segment 62 to form the cross-over electrode provide that the differential signal applied to pins 81 and 82 is converted to a single-ended signal at pins 92 and 93.

As indicated above, the secondary 20 of segments 61, 62 and 63 are connected into a common secondary. In segment 63, the secondary 20 couples energy back to the primary 15, which is interposed between electrodes 15 and 20, to which are connected pins 92 and 93. Therefore, when the primary and secondary in all segments have piezoelectric behavior, the present embodiment operates as a transformer with its input at pins 81 and 82 and its output at pins 92 and 93. As one skilled in the art understands, the impedance presented by the transformer at its input (pins 81 and 82) and at its output (pins 92 and 93) is determined by many factors, among which the area of the resonators in the input and output branches of the transformer. The present embodiment provides a simple method to scale the impedances presented at the input and output of the transformer. Such a switchable transformer is useful to perform impedance matching between a power source of a certain impedance and a load that has a different impedance.

Switchable piezoelectric materials are described in commonly-owned U.S. Utility patent application Ser. No. 12/391,490 filed on Feb. 24, 2009 to Sinha, et al. entitled "Devices Having a Tunable Acoustic Path Length and Methods for Making Same" that is incorporated by reference herein. Suitable switchable piezoelectric materials include displacive ferroelectric materials. The displacive ferroelectric material used in the devices described herein is preferably (but not exclusively) a perovskite crystal of the form $ABO_3$ or $ABCO_3$. Examples of these materials include barium strontium titanate ($Ba_xSr_{1-x}TiO_3$), lead strontium titanate ($Pb_xSr_{1-x}TiO_3$), strontium titanate ($SrTiO_3$), potassium tantalate ($KTaO_3$), calcium titanate ($CaTiO_3$), barium zirconium titanate ($Ba_xZr_{1-x}TiO_3$), barium titanate stanate ($BaSn_xTi_{1-x}O_3$), potassium tantalate niobate ($KNb_xTa_{1-x}O_3$) and rubidium potassium niobate ($Rb_xK_{1-x}NbO_3$). It should be noted that different materials exhibit switchable piezoelectric behavior over different temperature ranges. The switchable piezoelectric material thus may be selected so that the switchable power combiner has an operating temperature range suitable for the application (e.g. automotive applications where the desired temperature range is from about −85° C. to about +125° C.).

Switchable piezoelectric materials have negligible or no piezoelectric behavior at zero applied electric field. In that state, the switchable material is referred to as being switched off. The piezoelectric response of a switchable piezoelectric material increases monotonically with the applied electric field strength, until it saturates at high applied field strength. The field strength required to obtain a certain level of piezoelectric response is material dependent, and it depends upon other factors as well (e.g. temperature, layer thickness, etc.).

One benefit of using a switchable piezoelectric material in the primary or in the secondary (or both) of a multi-segment transformer is the ability to turn on and off one or more segment of the transformer, enabling on-the-fly high-efficiency reconfiguration of the circuit connected to the segmented switchable transformer, e.g. a segmented RF power amplifier. In the descriptions provided herein, we refer to the change of behavior of switchable piezoelectric materials as a function of applied electric field (or applied voltage) as a binary operation: in the on state, the switchable piezoelectric material is biased by a strong-enough applied electric field that the material exhibits strong piezoelectric behavior, whereas, in the off state, the applied electric field is weak enough that the material exhibits negligible piezoelectric behavior; in consequence, in the on state, the structures of FIGS. 1A, 1B, 1C, 1D and 1E operate as transformers that couple energy and can perform an impedance transformation between their primary and their secondary, whereas, in the off state, their primary or the secondary (or both) is off and no energy is coupled between secondary and primary. However, one skilled in the art understands that a switchable transformer operates over a continuum of electric field strength applied to the switchable piezoelectric material that forms the primary or secondary (or both) of the transformer.

Figure 2:
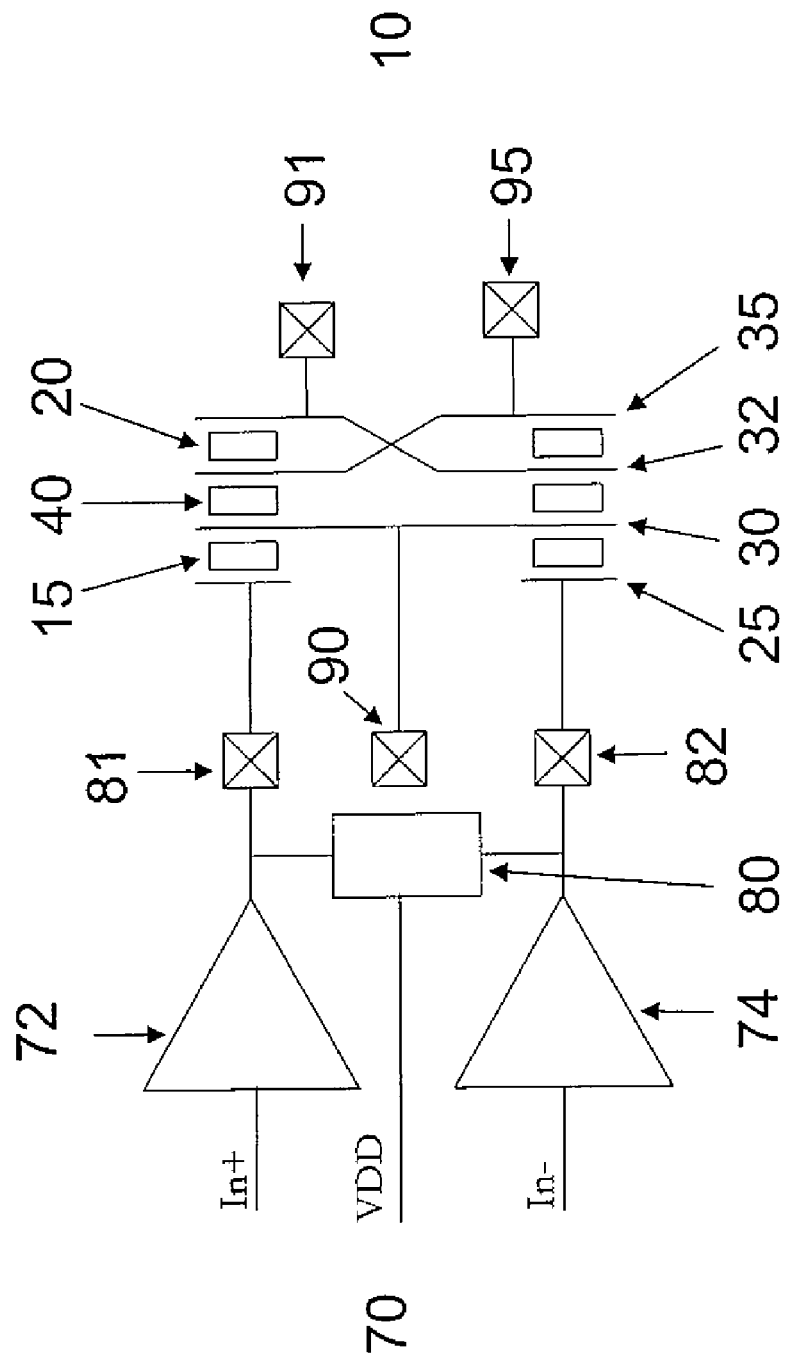
FIG. 2 is a schematic of a switchable power combiner based on the switchable transformer illustrated in FIG. 1D in accordance with an embodiment of the present invention.

FIG. 2 shows the segmented switchable transformer 10 illustrated in FIG. 1D connected to a differential power amplifier 70. The differential power amplifier has a first amplifier half circuit 72 and a second amplifier half circuit 74. The input to the first amplifier half circuit 72 is the non-inverting input of the differential power amplifier, and the input to the second amplifier half circuit 74 is the inverting input of the differential power amplifier. The power supply voltage that is provided to the inductor 80, connected to the output of first and second amplifier half circuits 72 and 74, is labeled $V_{DD}$ in the illustration. The center-tapped inductor 80 shown in the illustrated embodiment is a space-effective way to bias the differential power amplifier and to resonate all or some of the parasitic capacitance present at the power amplifier output and at the input (pins 81 and 82) of the transformer 10. It is advantageous if the quality factor of the inductor is as high as possible. One skilled in the art will appreciate that other circuit elements other than the illustrated inductors can be employed to achieve these results.

The outputs of first and second amplifier half circuits 72 and 74 are connected to the segmented first electrode 25 of transformer 10. The output of the first amplifier half circuit 72 is connected to transformer 10 through pin 81 and the output of the second amplifier half circuit 74 is connected through pin 82. Pins 81 and 82 are connected to segmented first electrode 25. Segmented first electrode 25 is adjacent the primary 15, which is fabricated with an above-described switchable piezoelectric material. Continuous electrode 30 is adjacent the primary 15 and connected to a pin 90 for providing a DC bias voltage to the primary 15. In the illustrated structure, the primary 15 is interposed between segmented electrode 25 and continuous electrode 30. It is advantageous if the thickness of the primary 15 is approximately one-half of the wavelength of the acoustic energy coupled to the primary.

Coupling layers 40 are adjacent continuous electrode 30. Coupling layers 40 allow for acoustic coupling between the primary and the secondary, and they include at least one layer of dielectric material so as to provide dielectric isolation between the primary and the secondary. In order to achieve acoustic coupling, it is advantageous if the thickness of coupling layers 40, which can be one or multiple layers, is about one-half of the wavelength of the acoustic wave transmitted from the primary 15 to the secondary 20. As noted above, coupling layers 40 are optional.

Coupling layers 40 are interposed between continuous electrode 30 and first continuous cross-over electrode 32 in one part of the segmented transformer 10, and between continuous electrode 30 and second continuous cross-over electrode 35 in another part of the segmented transformer 10, as illustrated. The secondary 20 is interposed between first cross-over electrode 32 and second cross-over electrode 35. The transformer drives a load through ports 91 and 95. First port 91 is connected to cross-over electrode 32 and second port 95 is connected to cross-over electrode 35. The load may be an antenna or a circuit that further processes the transformer output signal, such as an antenna impedance transformation circuit, a diplexer, a power detector, or a filter or other conventional circuits well known to one skilled in the art. In the embodiments described herein, the load is described as an antenna for purposes of illustration. In applications that use a single-ended load, one of ports 91 and 95 shall be connected to ground. Electrodes 32 and 35 cross-over as illustrated in order to convert the differential signal output by the differential power amplifier 70 on pins 81 and 82 to a single-ended signal at pins 91 and 95.

In this embodiment, the secondary 20 is made of a piezoelectric material, but one skilled in the art understands that secondary 20 can be made of a switchable piezoelectric material. In preferred embodiments, the thickness of the secondary 20 is an even multiple of the quarter wavelength (i.e. $\lambda/4$) as layers with such thicknesses provide good acoustic linkage throughout the structure. For example, for the even multiple of 2, the thickness is about one-half of the wavelength of the acoustic signal transmitted through the secondary 20.

When an above-threshold DC bias voltage is applied to pin 90, the primary 15 (which is made of a switchable piezoelectric material) has a piezoelectric behavior, which permits the acoustic coupling of the signals output by the differential power amplifier 70 through transformer 10 to pins 91 and 95 (i.e., the transformer is switched on). When the DC bias voltage is below threshold, the primary 15 does not have piezoelectric properties, so energy in the secondary cannot couple back into the primary and be lost to the circuit connected to the transformer secondary (e.g. the antenna).

Figure 3:
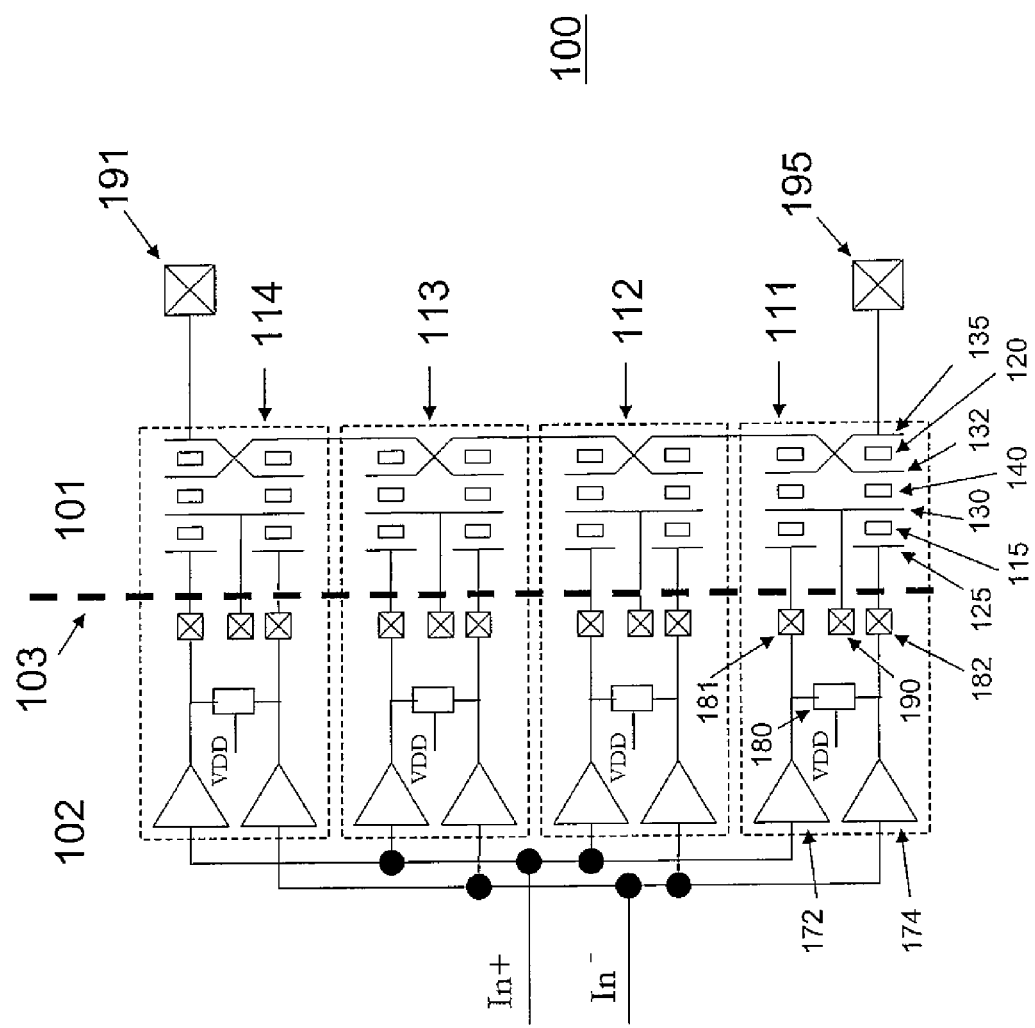
FIG. 3 is a schematic of a segmented switchable power combiner based on the switchable power combiner illustrated in FIG. 2.

A four-segment segmented switchable power combiner is illustrated in FIG. 3. Each of the four segments 111, 112, 113 and 114 has the configuration of the switchable power combiner illustrated in FIG. 2. For example, segment 111 includes a differential amplifier section and a transformer section. The differential amplifier consists of amplifier half circuits 172 and 174 that output a differential signal to pins 181 and 182. Pin 181 is connected to the output of amplifier half circuit 172 and pin 182 is connected to the output of amplifier half circuit 174. The outputs of amplifier half circuits 172 and 174 are bridged by a center-tapped inductor 180, which provides a space-effective means to bias the differential amplifier and to resonate parasitic capacitance present at the power amplifier output and at the primary of the transformer.

Pins 181 and 182 are connected to the segmented first electrode 125 of transformer section 101. The transformer section 101 is separated from the power amplifier output section 102 by dashed line 103. Segmented first electrode 125 is adjacent the primary 115, which is fabricated with an above-described switchable piezoelectric material. Continuous electrode 130 is adjacent primary 115 and connected to pin 190 for providing a DC bias voltage to primary 115. In the illustrated structure, the primary is interposed between segmented electrode 125 and continuous electrode 130. Coupling layers 140 are adjacent continuous electrode 130. Coupling layers 140 allow for acoustic coupling between the primary and the secondary, and they include at least one layer of dielectric material so as to provide dielectric isolation between the primary and the secondary. As noted above, coupling layers 40 are optional and they may be a single layer.

Coupling layers 140 are interposed between continuous electrode 130 and first cross-over electrode 132 in parts of the segmented transformer section 101, and between continuous electrode 130 and second continuous cross-over electrode 135 in other parts of the segmented transformer section 101, as illustrated. The secondary 120 is interposed between first cross-over electrode 132 and second cross-over electrode 135. First antenna port 191 is connected to electrode 132, and second antenna port 195 is connected to electrode 135. In applications that use a single-ended antenna, one of antenna ports 191 and 195 shall be connected to ground. Electrodes 132 and 135 cross-over as illustrated in order to combine and convert the differential signal output by each differential power amplifier to a single-ended signal at pins 191 and 195. The cross-over electrodes are configured such that they cross from one side of the secondary to the other side of the secondary in each segment and not between segments. The cross-over electrodes illustrated schematically are not electrically interconnected.

The illustrated embodiment has four segments, but one skilled in the art will appreciate that other embodiments may have more or fewer segments. Also, the illustrated embodiment has identical differential power amplifier sections in all segments, but one skilled in the art will appreciate that differential power amplifiers of different design and performance may be used in each segment. Furthermore, the illustrated embodiment has identical switchable transformers in all segments, but one skilled in the art will appreciate that switchable transformers of different design and performance may be used in each segment.

The embodiments described herein allow efficient reorganization of the output circuit of narrow-band RF circuits, such as RF power amplifiers, with low loss. Referring to FIG. 3, when full output power is desired, all four of the primaries 115 are switched on. At 3 dB back-off from full power, two of the four primaries 115 are switched off and their associated power amplifier half circuits (e.g. those in segments 111 and 112) are turned off. By switching off the piezoelectric effect in the primary 115 of segments 111 and 112, the acoustic energy flowing through the common secondary 120 cannot generate any loss in the segments 111 and 112 that are turned off, which is to say that the segments that are switched off do not load the antenna.

The illustrated embodiment has a differential power amplifier section in all segments, but one skilled in the art will appreciate that reactance elements may be connected to segmented first electrode 125, in substitution of (or in addition to) amplifiers 172 and 174, in any segment. Reactance elements are typically capacitors or inductors, or elements that provide capacitance or inductance. Therefore, the embodiments described herein allow efficient switching of reactance elements connected to the transformer primary, and thereby the efficient modification of the coupling angle of the transfer function from the power amplifier output to the antenna. As one skilled in the art will appreciate, the embodiments described herein thus provide the means to efficiently achieve impedance matching between a power amplifier and a variable-impedance antenna.

Figure 4:
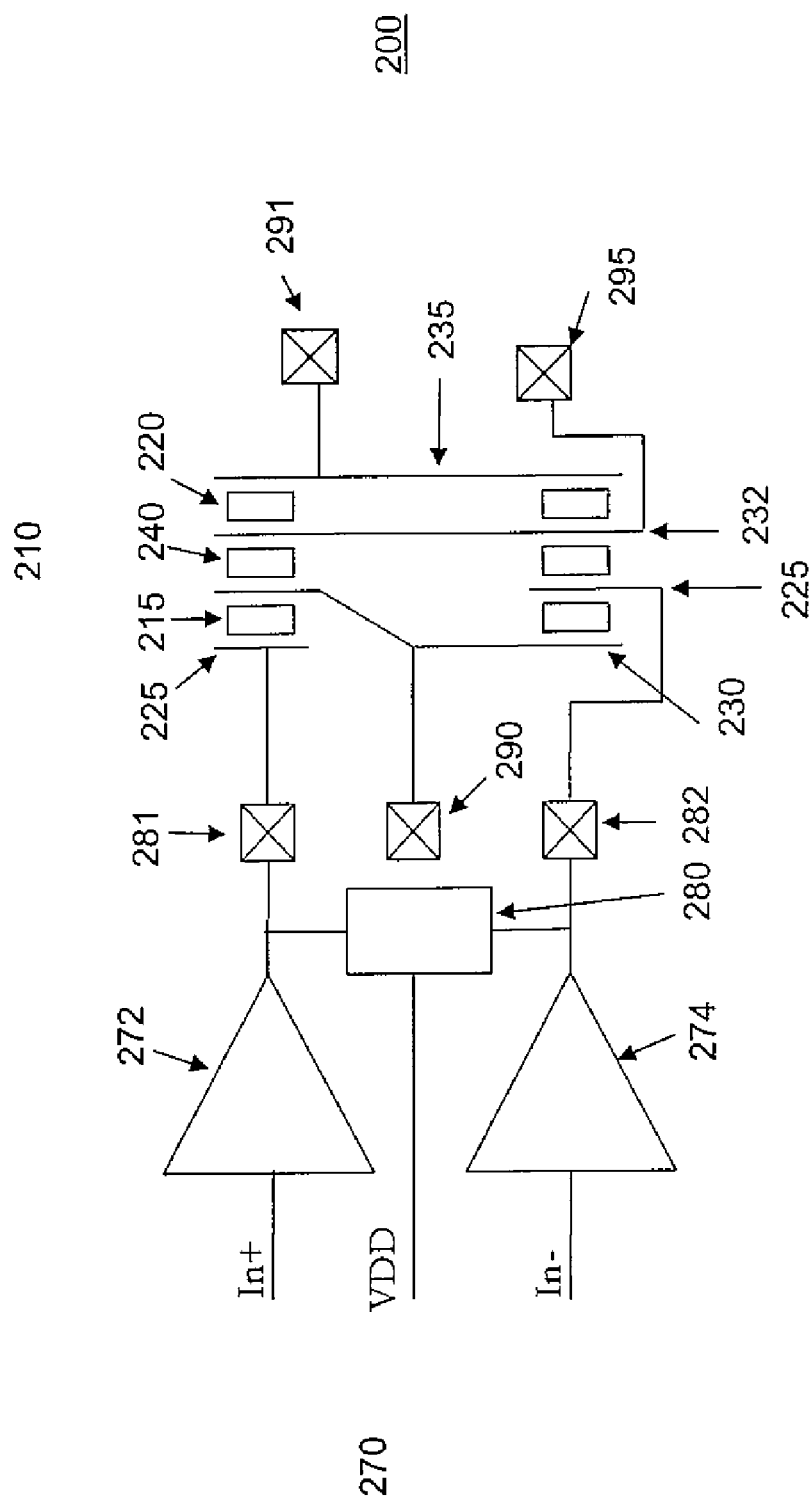
FIG. 4 is a schematic of a switchable power combiner based on the switchable transformer illustrated in FIG. 1D in accordance with an embodiment of the present invention.

An alternate embodiment of a switchable power combiner is illustrated in FIG. 4. The switchable power combiner 200 has a differential amplifier 270 and a transformer 210. The differential amplifier 270 has a first amplifier half circuit 272 and a second amplifier half circuit 274. The input to the first amplifier half circuit 272 is the non-inverting input of the differential amplifier, and the input to the second amplifier half circuit 274 is the inverting input of the differential amplifier. The power supply voltage that is provided to the inductor 280, connected to the output of first and second amplifier half circuits 272 and 274, is labeled $V_{DD}$ in the illustrated embodiment. The center-tapped inductor 280 is a space-effective way to bias the differential power amplifier and to resonate all or some of the parasitic capacitance present at the power amplifier output and at the input (pins 281 and 282) of transformer 210. It is advantageous if the quality factor of the inductor is as high as possible. One skilled in the art will appreciate that other circuit elements other than the illustrated inductors can be employed to achieve these results.

The outputs of first and second amplifier half circuits 272 and 274 are connected to the electrodes 225 and 230 of transformer 210. The output of the first amplifier half circuit 272 is connected to transformer 10 through pin 281 and the output of the second amplifier half circuit 274 is connected through pin 282. Segmented electrode 225 is adjacent the primary 215, which is made of an above-described switchable piezoelectric material. Crossover electrode 230 is adjacent the primary 215 and connected to a pin 290 for providing a DC bias voltage to primary 215. In the illustrated structure, the primary is interposed between electrodes 225 and 230. Electrodes 225 and 230 cross-over as illustrated in order to convert the differential signal output by the differential power amplifier 270 on pins 281 and 282 to a single-ended signal at pins 291 and 295. It is advantageous if the thickness of the primary 215 is approximately one-half the wavelength of the acoustic energy coupled to the primary.

Coupling layers 240 are adjacent cross-over electrode 230 in one part of the transformer 210, and adjacent electrode 225 in another part of the transformer 210, as illustrated. Coupling layers 240 allow for acoustic coupling between the primary and the secondary, and they include at least one layer of dielectric material so as to provide dielectric isolation between the primary and the secondary. In order to achieve acoustic coupling, it is advantageous if the thickness of coupling layers 240, which can be one or multiple layers, is about one-half of the wavelength of the acoustic wave transmitted from the primary 215 to the secondary 220. As noted above, coupling layers 240 are optional.

Coupling layer 240 is adjacent continuous electrode 232. The secondary 220 is interposed between first continuous electrode 232 and second continuous electrode 235. Antenna port 291 is connected to electrode 235, and antenna port 295 is connected to electrode 232. In applications that use a single-ended antenna, one of antenna ports 291 and 295 shall be connected to ground.

As noted above, the secondary 220 can be made of a switchable piezoelectric material or a piezoelectric material. In preferred embodiments, the thickness of the secondary 220 is an even multiple of the quarter wavelength (i.e. $\lambda/4$) as layers with such thicknesses provide good acoustic linkage throughout the structure. For example, for the even multiple of 2, the thickness is about one-half of the wavelength of the acoustic signal transmitted through the secondary 220.

When an above-threshold DC bias voltage is applied to pin 290, the primary 215 (which is made of a switchable piezoelectric material) has a piezoelectric behavior, which permits the acoustic coupling of the signals output by the differential power amplifier 270 through transformer 210 to pins 291 and 295 (i.e., the transformer is switched on). When the DC bias voltage is below threshold, the primary 215 does not have piezoelectric properties, so energy in the secondary cannot couple back into the primary and be lost to the circuit connected to the transformer secondary (e.g. the antenna).

Figure 5:
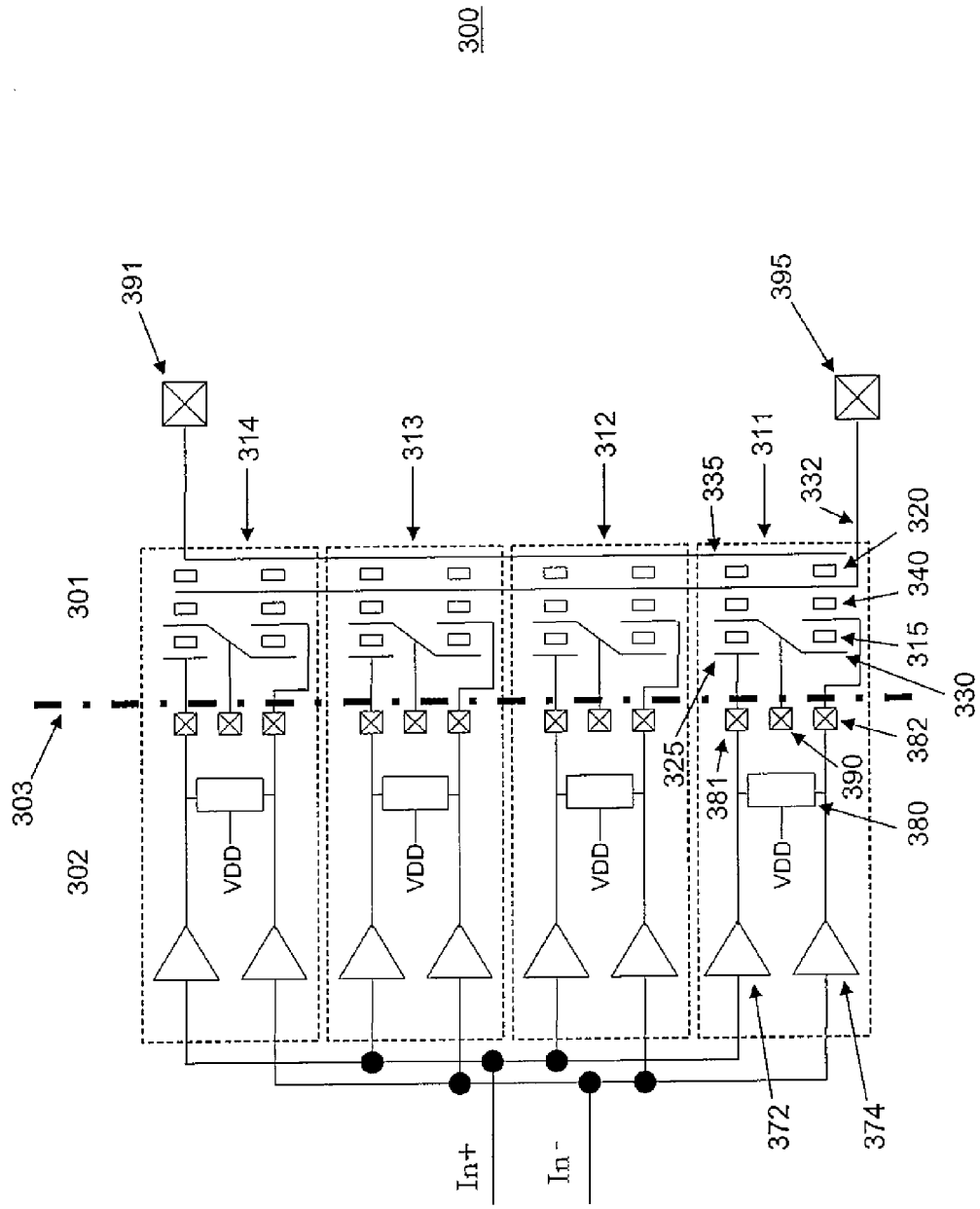
FIG. 5 is a schematic of a segmented switchable power combiner based on the switchable power combiner illustrated in FIG. 4.

A four-segment segmented switchable power combiner is illustrated in FIG. 5. Each of the four segments 311, 312, 313 and 314 has the configuration of the switchable power combiner illustrated in FIG. 4. For example, segment 311 includes a differential amplifier section and a transformer section. The differential amplifier consists of amplifier half circuits 372 and 374 that output a differential signal to pins 381 and 382. Pin 381 is connected to the output of amplifier half circuit 372 and pin 382 is connected to the output of amplifier half circuit 374. The outputs of amplifier half circuits 372 and 374 are preferably bridged by a center-tapped inductor 380, which provides a space-effective means to bias the differential amplifier and to resonate parasitic capacitance present at the power amplifier output and at the primary of the transformer.

Pins 381 and 382 are connected to the electrodes 325 and 330, respectively, of transformer section 301. Electrodes 325 and 330 cross-over as illustrated in order to combine and convert the differential signal output by each differential amplifier to a single-ended signal at pins 391 and 395. The cross-over electrodes are configured such that they cross from one side of the primary to the other side of the primary in each segment and not between segments. The transformer section 301 is separated from the power amplifier output section 302 by dashed line 303. Primary 315, which is made of an above-described switchable piezoelectric material, is interposed between electrode 325 and cross-over electrode 330. Cross-over electrode 330 is adjacent primary 315 and also connected to pin 390 for providing a DC bias voltage to primary 315. Coupling layers 340 are adjacent cross-over electrode 330 in parts of the segmented transformer section 301, and adjacent electrode 325 in other parts of the segmented transformer section 301, as illustrated. As discussed above, coupling layers 340 allow for acoustic coupling between the primary and the secondary, and they include at least one layer of dielectric material so as to provide dielectric isolation between the primary and the secondary. As noted above, coupling layers 340 are optional and they may be a single layer.

Coupling layer 340 is also adjacent continuous electrode 332. The secondary 320 is interposed between continuous electrode 332 and continuous electrode 335. Antenna port 391 is connected to electrode 335, and antenna port 395 is connected to electrode 332. In applications that use a single-ended antenna, one of antenna port 391 and 395 shall be connected to ground.

The illustrated embodiment has four segments, but one skilled in the art will appreciate that other embodiments may have more or fewer segments. Also, the illustrated embodiment has identical differential power amplifier sections in all segments, but one skilled in the art will appreciate that differential power amplifiers of different design and performance may be used in each segment. Furthermore, the illustrated embodiment has identical switchable transformers in all segments, but one skilled in the art will appreciate that switchable transformers of different design and performance may be used in each segment.

The illustrated embodiment has a differential power amplifier section in all segments, but one skilled in the art will appreciate that reactance elements may be connected to pins 381 and 382, in substitution of (or in addition to) amplifiers 372 and 374, in any segment, to allow the efficient modification of the coupling angle of the transfer function from the power amplifier output to the antenna, and thus provide the means to efficiently achieve impedance matching between a power amplifier and a variable-impedance antenna.

Figure 6:
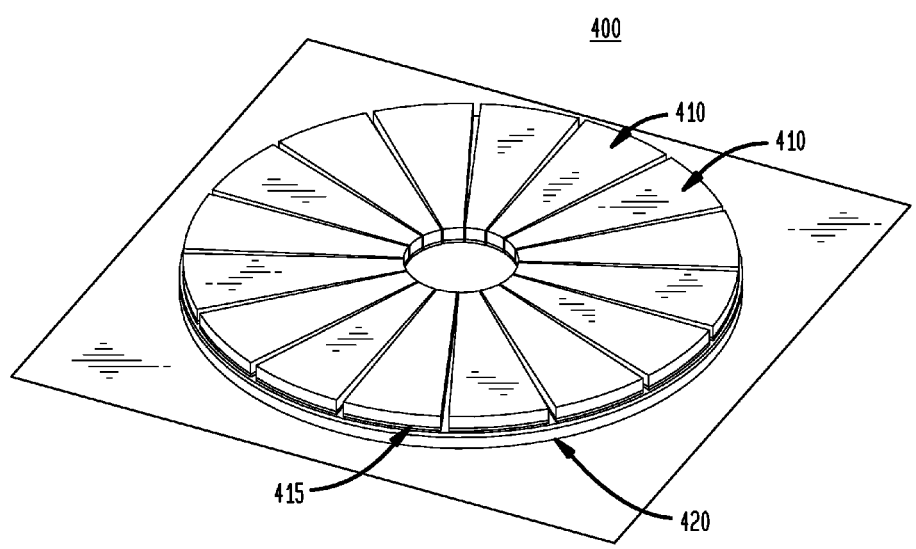
FIG. 6 is a perspective view of a segmented switchable transformer according to one embodiment of the present invention.

A structure of one embodiment of the segmented switchable transformer is shown in FIG. 6. In these FIGS. 6-9, the connection between the switchable transformer and the power amplifier output section is not expressly illustrated. However, one skilled in the art will appreciate that such connection will preferably be accomplished on the exterior of the illustrated structures because of the lack of room in the interior thereof. The illustrated embodiment is a Film Bulk Acoustic Resonator (FBAR) structure. The description of the operation of the FBAR structure in FIG. 6 applies equally to the solidly mounted resonator (SMR) configuration illustrated in FIG. 10. In FIG. 6, the transformer section, illustrated as 301 in FIG. 5, for example, is formed as individual wedge shaped segments 410. Each segment is a transformer element having a primary and secondary. The primary 415 is segmented and the secondary 420 is continuous. In the illustrated embodiment, the primary is made of a switchable piezoelectric material and the secondary is made of a piezoelectric material. However, embodiments in which both the primary and secondary are made of switchable piezoelectric materials, or the primary is made of a piezoelectric material and the secondary is made of a switchable piezoelectric material are also contemplated. The switchable transformer 400 is not illustrated as connected to a power amplifier. The power amplifier output section 302 is connected to the switchable transformer 400 in the manner illustrated in FIG. 5.

Figure 7:
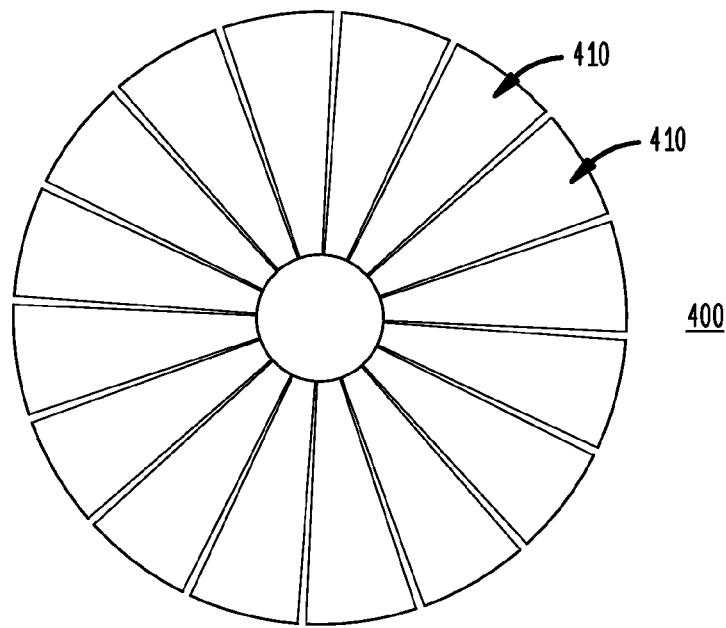
FIG. 7 is a top view of the segmented switchable transformer illustrated in FIG. 6.

The structure illustrated in FIG. 6 operates in the manner described in FIG. 5 and functions as a very efficient variable impedance transformer. As previously described, one or more segments 410 can be biased to switch on the primary for that section, with the output collected at the electrodes of the common secondary. The structure provides for electrically reconfigurable impedance transformation, depending on the number of sections that are switched on. FIG. 7 is a top view of the structure of FIG. 6 that illustrates the arrangement of the individual segments 410 that make up the transformer 400. One skilled in the art will appreciate that segments 410 need not be equal in shape or area. Circular symmetry is preferred, however, to minimize the losses between active segments, but one skilled in the art will understand that other non-circulosymmetric layouts and layouts where the transformer segments are non-adjacent are also possible and beneficial.

Figure 8:
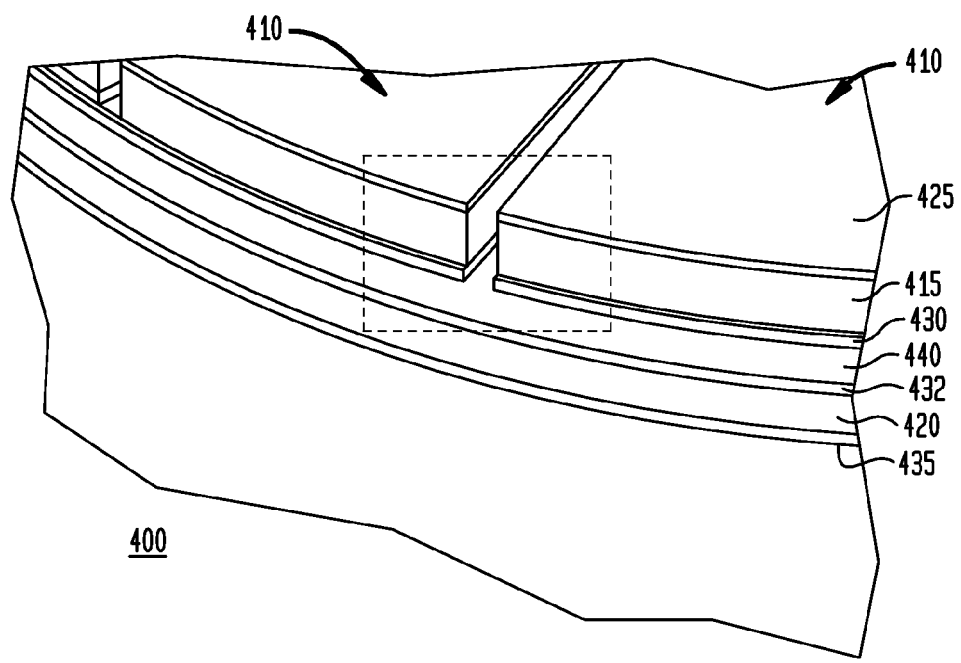
FIG. 8 is a side view of a portion of the segmented switchable transformer illustrated in FIG. 5.

FIG. 8 is a detailed view of a portion of the transformer 400 illustrating portions of two segments 410. The structure 400 is formed on a continuous supporting substrate. Because of the desire to monolithically integrate or co-package the structure with other components, it is advantageous that the supporting substrate be a common semiconductor industry substrate. Semiconductor industry substrates, as used herein, include all conventional substrates used for integrated circuits which include and are not limited to silicon (either crystalline or polycrystalline), doped silicon, compound semiconductors (e.g. III-V semiconductors) and the like materials, as well as other substrates used by the semiconductor and MEMS industries, including glass, borosilicate and the like materials. One skilled in the art is well aware of the substrate materials employed by the semiconductor and MEMS industries.

Figure 9:
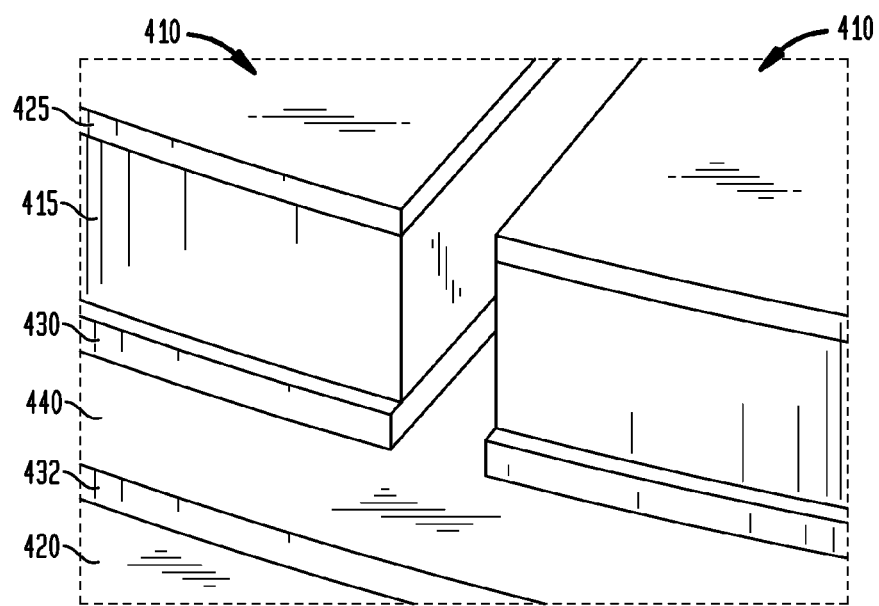
FIG. 9 is a detail view of the cross-section illustrated in FIG. 8.

FIG. 9 is a more detailed view of the portion of the transformer 410 illustrated in FIG. 8. Note that the layers 425, 415 and 430 are not continuous, and that there is a separation in these layers between segments 410. Primary 415 and the electrodes 425 and 430 between which primary 415 is interposed are all formed on a continuous structure formed of coupling layers 440 and secondary 420 interposed between electrodes 432 and 435.

Figure 10:
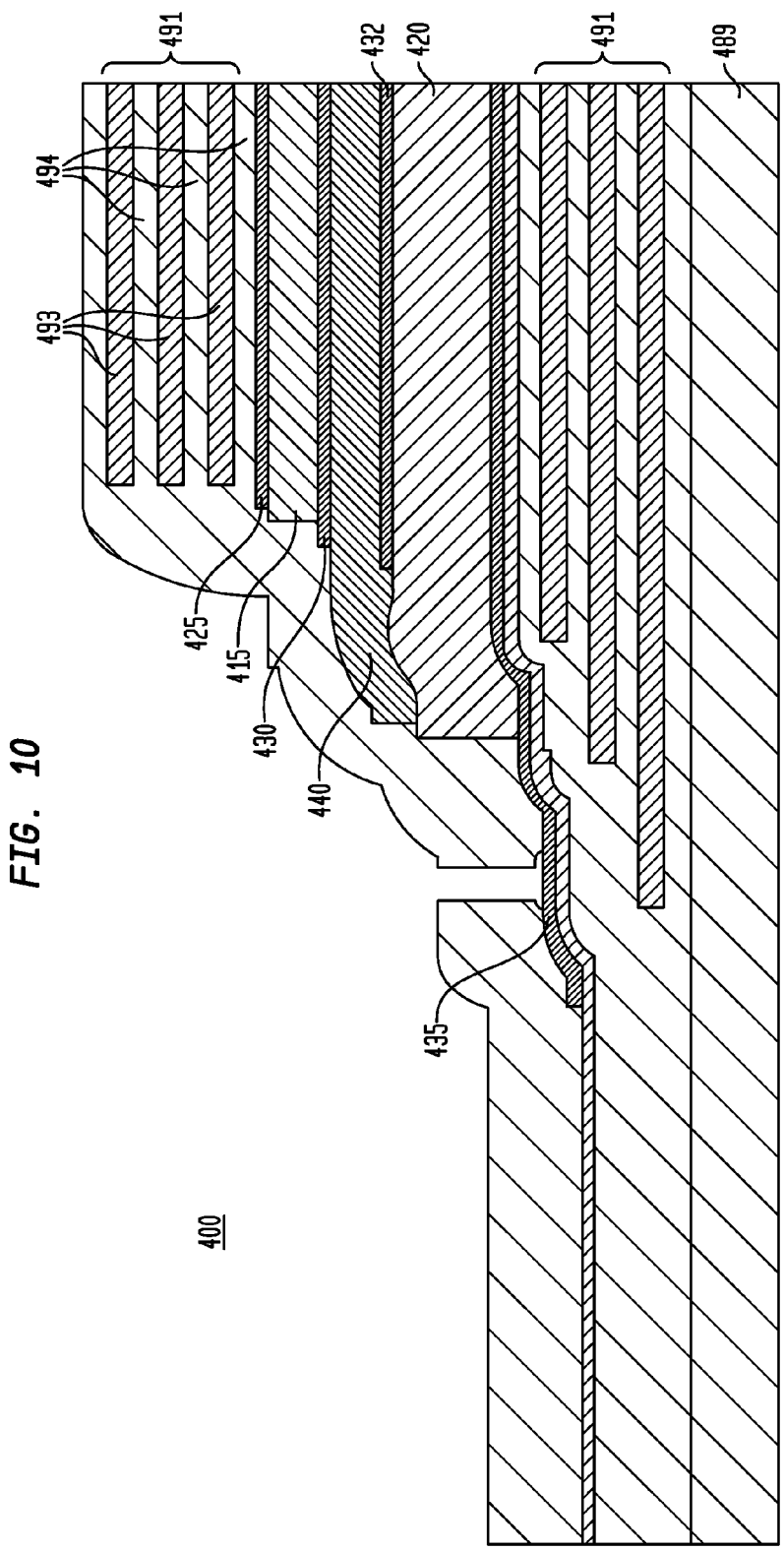
FIG. 10 is a cross section of a switchable transformer stack according to one embodiment of the present invention wherein the switchable transformer stack is interposed between energy-confining layers.

An alternative embodiment of the present invention is illustrated in FIG. 10. FIG. 10 is a cross-section of a structure similar to that illustrated in FIGS. 6-9. That is the transformer section has a vertical stack of layers starting with electrode 435 on which is formed secondary 420 and electrode 432. The coupling layers 440 are formed on electrode 432 and electrode 430 is formed on coupling layers 440 on which the primary is deposited. Electrode 425 is formed on primary 415. Again, the primary is formed of a switchable piezoelectric material that exhibits piezoelectric behavior when subjected to an above-threshold bias voltage. The secondary 420 can be formed of this same material but it is not required. Secondary 420 can be formed of a conventional piezoelectric material.

The structure described above is interposed between two acoustic confinement structures (referred to as Bragg reflectors) that confine the acoustic energy in the transformer structure. Each acoustic confinement structure 491 has alternating layers of high acoustic impedance material 493 and low acoustic impedance material 494. The entire structure is formed on a semiconductor substrate 489. Thus, FIG. 10 illustrates an embodiment of the present invention wherein the transformer is implemented as a solidly mounted resonator (SMR) with energy-confining Bragg reflector layers. Bragg reflector layers suitable for use in the present invention are described in commonly owned patent application Ser. No. 12/002,524 to Sinha et al. entitled "Integrated Acoustic Bandgap Devices For Energy Confinement And Methods Of Fabricating Same" which was filed on Dec. 17, 2007 and which is hereby incorporated by reference.

The combination of one layer of high acoustic impedance 493 and one layer of low acoustic impedance 494 is referred to as a period. The number of periods and their placement in the acoustic confinement structure 491 is largely a matter of design choice. While the illustrated embodiment has three periods above and three periods below the illustrated transformer, other embodiments may have more or fewer periods. Furthermore, there is no requirement that the structure be the illustrated "double Bragg reflector", with a periodic structure both above and below the transformer. Other embodiments may have only one Bragg reflector placed either above or below the transformer.

Examples of suitable low acoustic impedance materials are silicon (Si), polysilicon, silicon dioxide ($SiO_2$), silicon oxycarbide ("$SiO_xC_y$"), aluminum (Al) and, polymers and polymethylmethacrylate ("PMM"). Examples of high acoustic impedance material include gold (Au), molybdenum (Mo) tungsten (W), iridium (Ir), platinum (Pt), tantalum pentoxide ("$TaO_5$") and aluminum nitride (AlN). In one embodiment, the first layer of low acoustic impedance material is interposed between the bottom electrode and the first layer of high acoustic impedance, and the second layer of low acoustic impedance material is interposed between the top electrode and the second layer of high acoustic impedance material.

Figure 11:
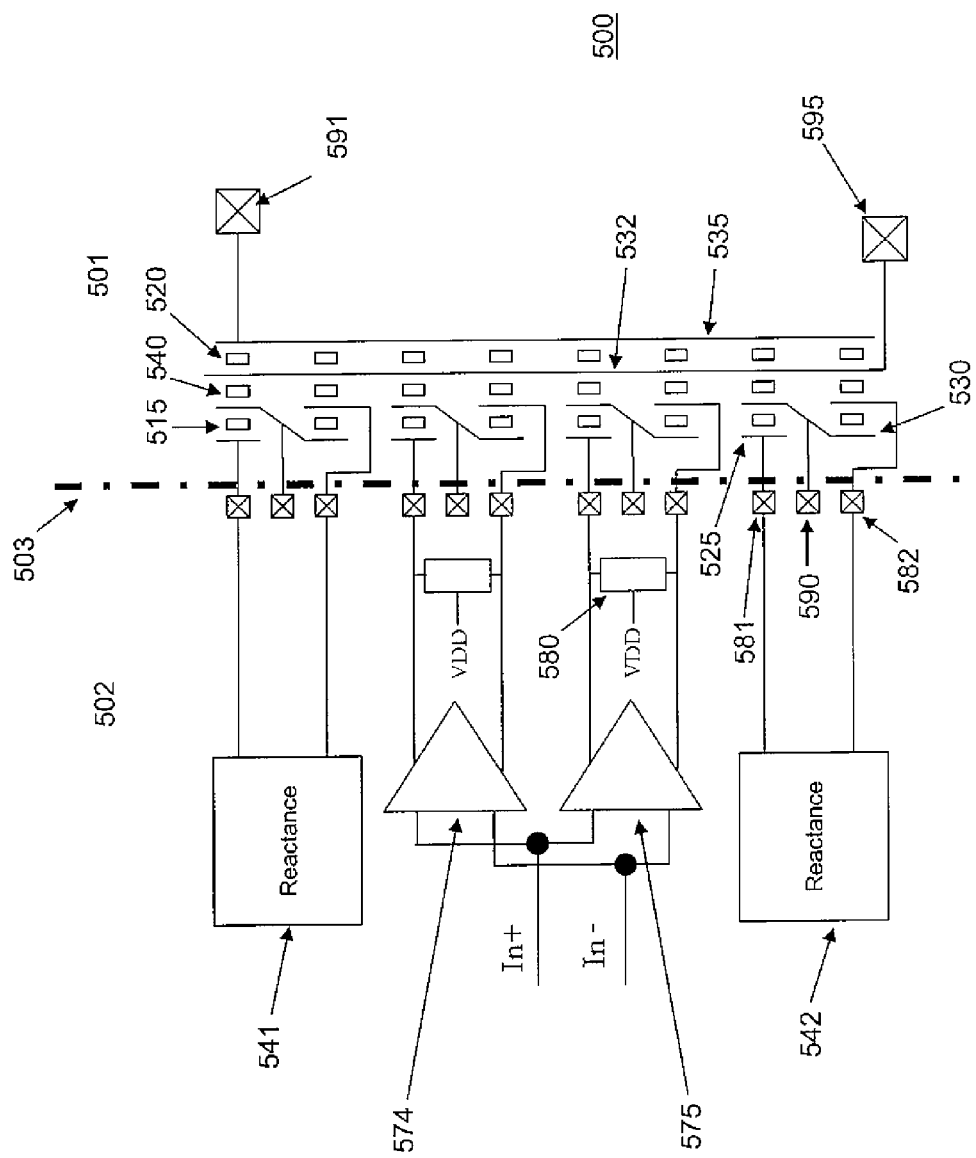
FIG. 11 is a schematic of a segmented switchable poser combiner illustrating the use of reactances to vary the imaginary part of the impedance in accordance with one embodiment of the present invention.

Another embodiment of the switchable power combiner is illustrated in FIG. 11. FIG. 11 illustrates a four-segment switchable power combiner 500 with a power amplifier output section 502 and a transformer section 501. The transformer section 501 is separated from the power amplifier output section 502 by dashed line 503. The transformer section 501 is similar to the transformer section 401 of the switchable power combiner 400 illustrated in FIG. 5.

In this embodiment, the power amplifier output section has two parallel differential amplifiers 574 and 575, and two reactance elements 541 and 542, all connected to the segmented primary of the transformer section. Reactance elements are typically capacitors or inductors, or elements that provide capacitance or inductance. By efficiently switching the primary connected to certain reactance elements, it is possible to change the imaginary part of the impedance presented to the antenna at ports 591 and 595.

The illustrated embodiment has four segments, but one skilled in the art will appreciate that other embodiments may have more or fewer segments. Likewise, one skilled in the art will appreciate that different differential amplifier designs and different reactances may be used in the switchable power combiner.

Figure 12:
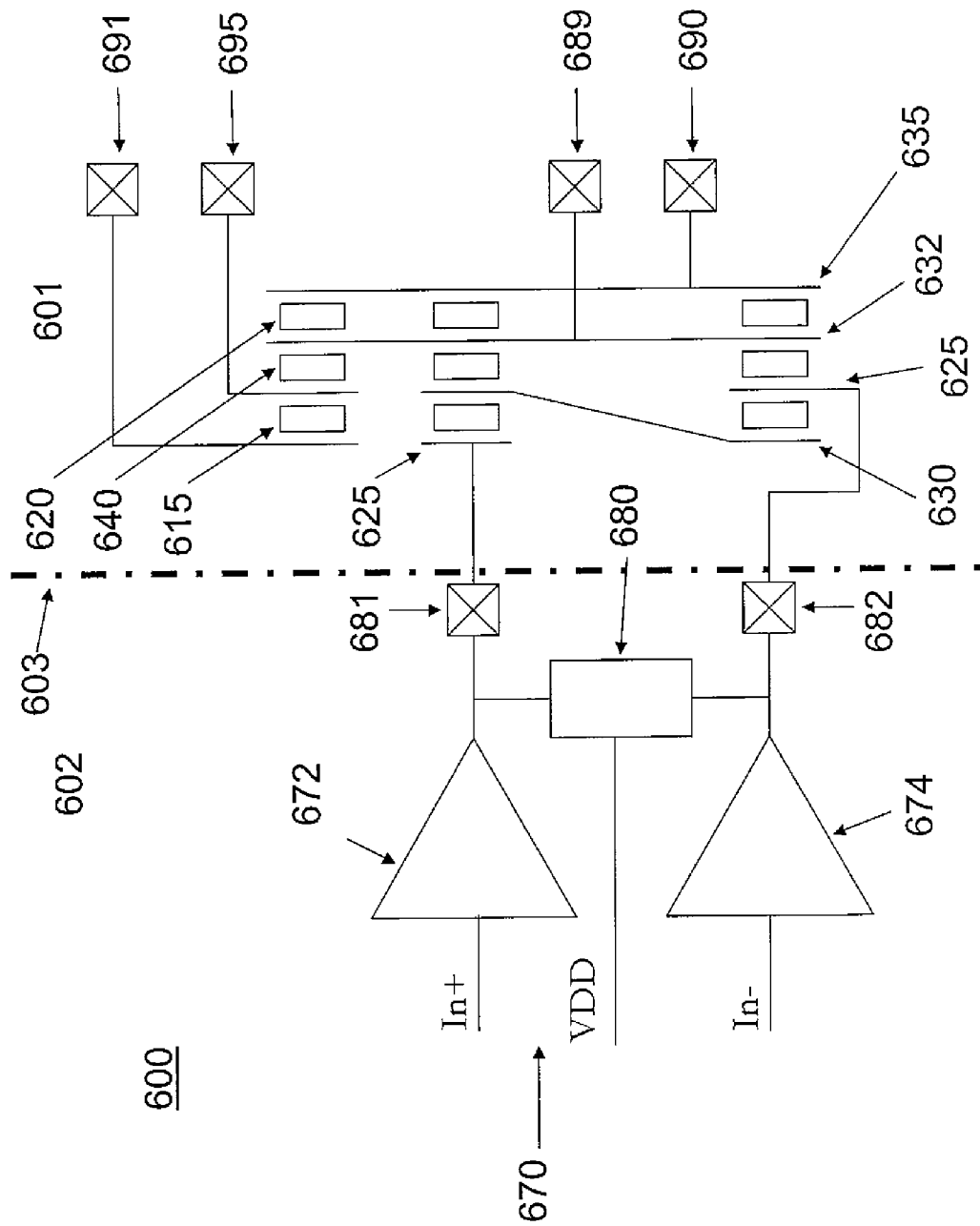
FIG. 12 is a schematic of a switchable power combiner based on the switchable transformer illustrated in FIG. 1E.

Another embodiment is illustrated in FIG. 12. This figure depicts a switchable power combiner segment 600. Segment 600 consists of a differential amplifier output section 602 connected to a switchable transformer section 601. Dashed line 603 indicates the separation between the sections. For the purposes of this embodiment, the reader can assume that the definition of differential amplifier output section 602 is identical to that of differential output amplifier 70 illustrated in FIG. 2.

The transformer section 601 is an instance of the switchable transformer illustrated in FIG. 1E. The inputs of the transformer are connected to the differential power amplifier 670 via pins 681 and 682. In the case where secondary 20 is made of a switchable piezoelectric material described above, pins 689 and 690, connected to the secondary electrodes 632 and 635 respectively, are used to apply the DC bias voltage to the secondary, and thereby switch on or switch off the combiner segment.

The illustrated transformer section has primaries and secondaries drawn of equal size, but one skilled in the art will appreciate that the area of the primaries and secondaries can be designed to be of different sizes, for example to achieve impedance scaling as described above.

One well-versed in the art will appreciate that the switchable power combiner segment 600 can be composed into power combiner architectures that are analogous to previously described switchable power combiner architectures 100, 300 and 500.

The illustrated embodiments are examples of how switchable power combiners can be used to combine the output of segmented power amplifiers, as well as reactances, to generate different linear load lines. The real part of the impedance presented to the antenna can be adjusted by changing the set of power amplifiers whose outputs are combined. The imaginary part of the impedance is also adjustable to cancel changes in the antenna impedance. The imaginary part of the impedance presented to the antenna is adjusted by changing the set of reactances that are combined.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A switchable power combiner comprising:
   a transformer section comprising an acoustically coupled primary and a secondary, at least one of the primary and the secondary is formed from a material with a switchable piezoelectric property such that the material exhibits piezoelectric behavior when the transformer section with the switchable piezoelectric material is at or above a threshold condition and exhibits negligible piezoelectric behavior when the transformer section with the switchable piezoelectric material is below the threshold condition and wherein the transformer section is connected to at least one input and at least one output.

2. The switchable power combiner of claim 1 further comprising a first electrode, a second electrode and a third electrode, wherein the primary is interposed between the first and second electrodes and the secondary is interposed between the second and third electrodes and the second electrode is a common electrode for the primary and secondary.

3. The switchable power combiner of claim 1 wherein the transformer further comprises a coupling layer interposed between the primary and the secondary.

4. The switchable power combiner of claim 3 further comprising a first electrode, a second electrode, a third electrode and a fourth electrode, wherein the primary is interposed between the first and second electrodes, the coupling layer is interposed between the second and third electrodes, and the secondary is interposed between the third and fourth electrodes and the second electrode is a common electrode for the primary and coupling layers and the third electrode is a common electrode for the coupling layer and the secondary.

5. The switchable power combiner of claim 1 wherein the primary and the secondary are both switchable piezoelectric materials.

6. The switchable power combiner of claim 1 wherein the other of the primary and the secondary is a piezoelectric material.

7. The switchable power combiner of claim 1 where in the primary is a switchable piezoelectric material and the secondary is a piezoelectric material.

8. The switchable power combiner of claim 1 wherein the primary is a piezoelectric material and the secondary is a switchable piezoelectric material.

9. The switchable power combiner of claim 1 wherein the switchable piezoelectric material is a displacive ferroelectric material.

10. The switchable power combiner of claim 9 wherein the switchable piezoelectric material is a perovskite crystal selected from the group consisting of barium strontium titanate ($Ba_xSr_{1-x}TiO_3$), lead strontium titanate ($Pb_xSr_{1-x}TiO_3$), strontium titanate ($SrTiO_3$), potassium tantalate ($KTaO_3$), calcium titanate ($CaTiO_3$), barium zirconium titanate ($Ba_xZr_{1-x}TiO_3$), barium titanate stanate ($BaSn_xTi_{1-x}O_3$), potassium tantalate niobate ($KNb_xTa_{1-x}O_3$) and rubidium potassium niobate ($Rb_xK_{1-x}NbO_3$).

11. The switchable power combiner of claim 4 further comprising an output section connected to the transformer section wherein the output section is a signal source for the transformer section and wherein the transformer section is also connected to a load element.

12. The switchable power combiner of claim 11 wherein the output section comprises a plurality of elements at least one of which is a power amplifier.

13. The switchable power combiner of claim 12 wherein the first electrode is a segmented electrode at least one segment coupled to a first output from the output section and a second segment coupled to a second output of the output section, wherein the second electrode is connected to a voltage source and the third and fourth electrodes are cross-over electrodes.

14. The switchable power combiner of claim 13 wherein the output section comprises first and second power amplifiers, wherein the output of the first amplifier is connected to a first segment of the first electrode and the output of the second amplifier is connected to a second segment of the first electrode.

15. The switchable power combiner transformer of claim 14 wherein a load bridges the first and second amplifier outputs.

16. The switchable power combiner of claim 14, wherein the output section comprises a plurality of first amplifiers and a plurality of second amplifiers, each pair of first and second amplifiers forming a segment of the input section.

17. The switchable power combiner of claim 11 wherein the first and second electrodes are cross-over electrodes and the third and fourth electrodes are continuous electrodes.

18. The switchable power combiner of claim 17 wherein the output section comprises first and second power amplifiers, wherein the output of the first amplifier is coupled to the first electrode portion of the cross-over electrode and the output of the second amplifier is coupled to the second electrode portion of the cross-over electrode.

19. The switchable power combiner of claim 18 wherein a load bridges the first and second amplifier outputs.

20. The switchable power combiner of claim 18, wherein the output section comprises a plurality of first amplifiers and a plurality of second amplifiers, each pair of first and second amplifiers forming a segment of the input section.

21. The switchable power combiner of claim 4 wherein the transformer section is a monolithic structure comprising a substrate, the fourth electrode is formed on the substrate, the secondary is formed on the fourth electrode, wherein the secondary is a continuous layer formed of piezoelectric layer, the third electrode is formed on the secondary, the coupling layer is formed on the third electrode wherein the coupling layer is a continuous layer of insulating material which permits acoustic coupling between the third and second electrodes, the second electrode is formed on the coupling layer wherein the second layer is patterned, the primary is formed on the patterned second electrode wherein the primary is also patterned into segments and the first electrode is formed on the primary, the first electrode also being patterned into segments.

22. The switchable power combiner of claim 21 wherein a first segment of the transformer section is connected to a first segment of an output section wherein the output section is a signal source for the transformer section comprising a plurality of segments, the first segment comprising first and second power amplifiers, the output of the first and second power amplifiers being connected to the first and second electrodes of the first segment of the transformer section.

23. The switchable power combiner of claim 22 wherein the outputs of a plurality of the output section segments are connected to a respective number of transformer section segments.

24. The switchable power combiner of claim 21 further comprising an acoustic confinement structure.

25. The switchable power combiner of claim 24 wherein the acoustic confinement structure is adjacent the monolithic transformer structure and comprises at least one layer of high impedance material and one layer of low impedance material.

26. The switchable power combiner of claim 25 wherein the acoustic confinement structure has a plurality of layers of high impedance material alternating with a plurality of layers of low impedance material.

27. The switchable power combiner of claim 26 comprising a first acoustic confinement structure above the monolithic transformer section and a second acoustic confinement structure interposed between the monolithic transformer section and the supporting substrate.

28. The switchable power combiner of claim 4 wherein the primary and secondary are segmented into at least three segments and the primary is a switchable piezoelectric material, and wherein the first electrode and the second electrode are segmented such that one segment of the first electrode is electrically connected to another segment of the second electrode, thereby providing first and second cross-over electrodes, and wherein third and fourth electrodes are not cross-over electrodes and wherein first and second segments of the first electrode are connected to inputs to the transformer section and a segment of the first electrode and a segment of the second electrode are connected to outputs of the transformer section.

29. The switchable power combiner of claim 12 wherein the output section further comprises at least one reactance connected to at least one segment of the transformer section.

30. The switchable power combiner of claim 11 wherein the output section comprises a plurality of elements at least one of which is a power amplifier and wherein the primary and secondary are segmented into at least three segments and the primary is a switchable piezoelectric material, and wherein the first electrode and the second electrode are segmented such that one segment of the first electrode is electrically connected to another segment of the second electrode, thereby providing first and second cross-over electrodes, and wherein third and fourth electrodes are not cross-over electrodes and wherein first and second segments of the first electrode are connected to inputs to the transformer section and a segment of the first electrode and a segment of the second electrode are connected to outputs of the transformer section.

31. The switchable power combiner of claim 29 wherein the output section comprises first and second power amplifiers, wherein the output of the first amplifier is connected to a first segment of the first electrode and the output of the second amplifier is connected to the segment of the first electrode that is electrically connected to the second electrode.

32. The switchable power combiner of claim 30 wherein a load bridges the first and second amplifier outputs.

33. The switchable power combiner of claim 15 wherein the load is an inductor.

34. The switchable power combiner of claim 19 wherein the load is an inductor.

35. The switchable power combiner of claim 31 wherein the load is an inductor.

\* \* \* \* \*